United States Patent
Donaton et al.

(10) Patent No.: US 6,255,227 B1
(45) Date of Patent: Jul. 3, 2001

(54) ETCHING PROCESS OF $CoSi_2$ LAYERS

(75) Inventors: Ricardo Alves Donaton, Heverlee; Karen Irma Josef Maex, Herent; Rita Verbeeck, Rotselaar; Philippe Jansen, Olen; Rita Rooyackers, Leuven; Ludo Deferm, Beverloo; Mikhail Rodionovich Baklanov, Leuven, all of (BE)

(73) Assignee: Interuniversitair Microelektronica Centrum, Leuven (BE)

( * ) Notice: Subject to any disclaimer, the term of this patent is extended or adjusted under 35 U.S.C. 154(b) by 0 days.

(21) Appl. No.: 09/478,252

(22) Filed: Jan. 6, 2000

Related U.S. Application Data

(63) Continuation of application No. 08/814,973, filed on Jun. 19, 1996.
(60) Provisional application No. 60/002,426, filed on Jun. 19, 1995.

(51) Int. Cl.[7] .......................... H01L 21/302; H01L 21/00
(52) U.S. Cl. ............................ 438/745; 438/48; 216/100; 216/108; 216/109
(58) Field of Search ..................... 438/48, 745, 749; 216/100, 108, 109

(56) References Cited

U.S. PATENT DOCUMENTS

| | | | |
|---|---|---|---|
| 5,605,865 | * 2/1997 | Maniar et al. | 437/200 |
| 5,821,175 | * 10/1998 | Engelsberg | 438/795 |
| 5,937,319 | * 8/1999 | Xiang et al. | 438/585 |
| 6,048,405 | * 4/2000 | Skrovan et al. | 134/1 |
| 6,074,960 | * 6/2000 | Lee et al. | 438/749 |
| 6,120,354 | * 9/2000 | Koos et al. | 451/41 |

* cited by examiner

*Primary Examiner*—John F. Niebling
*Assistant Examiner*—Viktor Simkovic
(74) *Attorney, Agent, or Firm*—Knobbe, Martens, Olson, and Bear LLP

(57) ABSTRACT

The present invention relates to methods for controlling the etching rate of $CoSi_2$ layers by adjusting the pH of an HF-based solution to obtain the desired etch rate. The pH of the HF-based solution may be adjusted by adding pH modifying chemicals to the solution. A further aspect of the invention is an improved method for manufacturing Schotky barrier infared detectors employing the controlled etching step. A method for reducing drain induced barrier lowering in an active transistor having a small gate length is also provided.

10 Claims, 7 Drawing Sheets

ETCHING PROCESS OF COSI$_2$ LAYERS

RELATED APPLICATIONS

This application is a continuation of Ser. No. 08/814,973 filed on Jun. 19, 1996, which claims priority from U.S. provisional application 60/002,426 filed Jun. 19, 1995.

BACKGROUND OF THE INVENTION

The use of cobalt disilicide (CoSi$_2$) in microelectronics applications is becoming more and more important. In CMOS technology, with the scaling down of dimensions, especially for CMOS technology manufacturing of a transistor with a gate length smaller than 0.35 μm, CoSi$_2$ has become an attractive material due to its better characteristics when compared to the more frequently used titanium disilicide (TiSi$_2$).

The interaction of a silicide film with chemicals and reactive gasses during further processing is an important issue in maintain the integrity of the film in the fully integrated structure. TiSi$_2$ is known to be very reactive with chemicals such as ammonium hydroxide (NH$_4$OH—) and hydrogen fluoride-based (HF-based) solutions. CoSi$_2$ is much more robust in that respect. In general, wet etching of CoSi$_2$ is considered very difficult.

SUMMARY OF THE INVENTION

The present invention relates to an etching process for CoSi$_2$ layers in semiconductor processing. Specifically, the present invention relates to methods for accurately controlling the etching rate of CoSi$_2$ layers in semiconductor processing by adjusting the pH of an HF-based solution. The pH of this solution is regulated by adding pH modifying chemicals to the HF-based solution. Preferably, the pH modifying chemicals are H$_2$SO$_4$ or HCl (in order to reduce the pH) or NH$_4$OH (in order to increase the pH of the HF-based solution). The HF-based solution can be a buffered solution or not.

In one aspect of the present invention, the pH of the HF-based solution is from about 0 to about 1.5 in order to have a rather fast etching rate of the CoSi$_2$ layer.

In another aspect of the present invention, the pH of the HF-based solution is from about 1.5 to about 5.5 in order to have a lower, but basically constant etching rate.

In yet another aspect of the present invention, the pH of the HF-based solution is from about 5.5 to about 14 in order to have no or at least insignificant etching rate of CoSi$_2$. This aspect of the invention is preferred for obtaining a selective etch of an oxide spacer while no etching of CoSi$_2$ layer occurs in the integration process for active transistors using self-aligned pocket implantation.

The present invention also relates to the use of this etching process for the formation of Schottky barrier infrared detectors. One aspect of the present invention is the manufacturing of Schottky barrier infrared detectors which are improved over those currently available. This aspect of the invention is particularly useful for Schottky barrier infrared detectors with CoSi$_2$/Si interface. Preferably, the Schottky barrier infrared detector has a CoSi$_2$/Si$_{1-x}$Ge$_x$ interface.

In addition, the present invention relates to the use of the etching process as a process step for self-aligned pocket implantation in semiconductor devices. Furthermore, the present invention relates to the use of the etching process to obtain selective etching.

A further aspect of the present invention is to improve the process of self-aligned pocket implantation using oxide spacers in semiconductor manufacturing process. More particularly, this aspect relates to the use of a specific process step based on selective etching of CoSi$_2$, while the other conventional process steps are still maintained. Thus, use of the present invention has little effect on the global costs of whole process integration in active transistors fabrication.

The present invention also relates to a method of manufacturing CoSi$_2$/Si Schottky barrier infrared detectors comprising the steps of:

a) growing a Si$_{1-x}$Ge$_x$ layer on a silicon substrate;

b) growing a Si sacrificial layer on the top of the Si$_{1-x}$Ge$_x$ layer;

c) depositing a Co layer on said Si sacrificial layer;

d) heating the Co layer in order to obtain a CoSi$_2$ layer;

e) depositing a photoresist strip on said CoSi$_2$ layer;

f) developing the photo-resist strip using a masking layer in order to create the required patterning of the CoSi$_2$ layer;

g) etching the CoSi$_2$ layer with a HF-based solution having a pH value smaller than 1.5; and h) removing the photoresist strip.

Preferably, the Schottky barrier infrared detectors are CoSi$_2$/Si$_{1-x}$Ge$_x$ Schottky barrier infrared detectors.

Another aspect of the present invention is a method of self-aligned pocket implantation in an active transistor having a small gate length comprising the steps of:

a) defining an active area within a semiconductor substrate with a source region, a drain region and a gate region;

b) defining a silicon oxide spacer in between said source and said gate and in between said drain and said gate;

c) forming a CoSi$_2$ top layer selectively on said drain, gate, and source regions;

d) etching the silicon oxide spacer using a HF-based solution having a pH higher than 3; and e) implanting dopants in order to achieve a pocket implantation self-aligned towards said gate region and said CoSi$_2$, top layer.

In one aspect of the above embodiment, the HF-based solution is a buffered solution having a pH of about 4.5. In another aspect of the above embodiment, the dopants are of the opposite kind for the source and drain implants. In yet another aspect of this embodiment, the dopants are of the same kind for the source and drain implants. In a further aspect of the above method, the transistor is a CMOS transistor having a gate length less than 0.35 μm.

DETAILED DESCRIPTION OF THE PREFERRED EMBODIMENT

As an example, cobalt silicides are formed on n-type oriented silicon, 125 mm wafers. Standard RCA cleaning followed by an HF dip for hydrogen passivation of the silicon surface was performed just before loading the wafers into the deposition system. Co layers with thickness of 8 nm, 16 nm and 40 nm were deposited using a BALZERS BAS450 DC magnetron sputtering system. The base pressure was always better than $3.0 \times 10^{-6}$ mbar. A two-step silicidation process was carried out in an AST rapid thermal processor, in a nitrogen ambient. The temperatures of the first and second annealing steps were 550° C. and 700° C., respectively. Between these two annealing steps, a selective etch in a $H_2SO_4/H_2O_2$ solution was done to remove the unreacted metal on top of the silicide.

To investigate the etching rate of $CoSi_2$ in hydrogen fluoride (HF) based solutions, concentrations of 0.5 and 2 wt % of HF were used, as well as a buffered hydrogen fluoride (BHF) solution, which is formed from 1 part of HF 50% and 7 parts of $NH_4F$ 40%. Etching times from 10 seconds to 15 minutes were tested. $H_2SO_4$ or HCl or $NH_4OH$ were added to the solutions to change their pH. The pH values of the solutions were measured with pH paper.

The thinning of the $CoSi_2$ layers was monitored by four point probe sheet resistance measurements (before and after etching). The samples were also characterized by scanning electron microscopy (SEM) and Rutherford backscattering spectroscopy (RBS).

Figure 1:
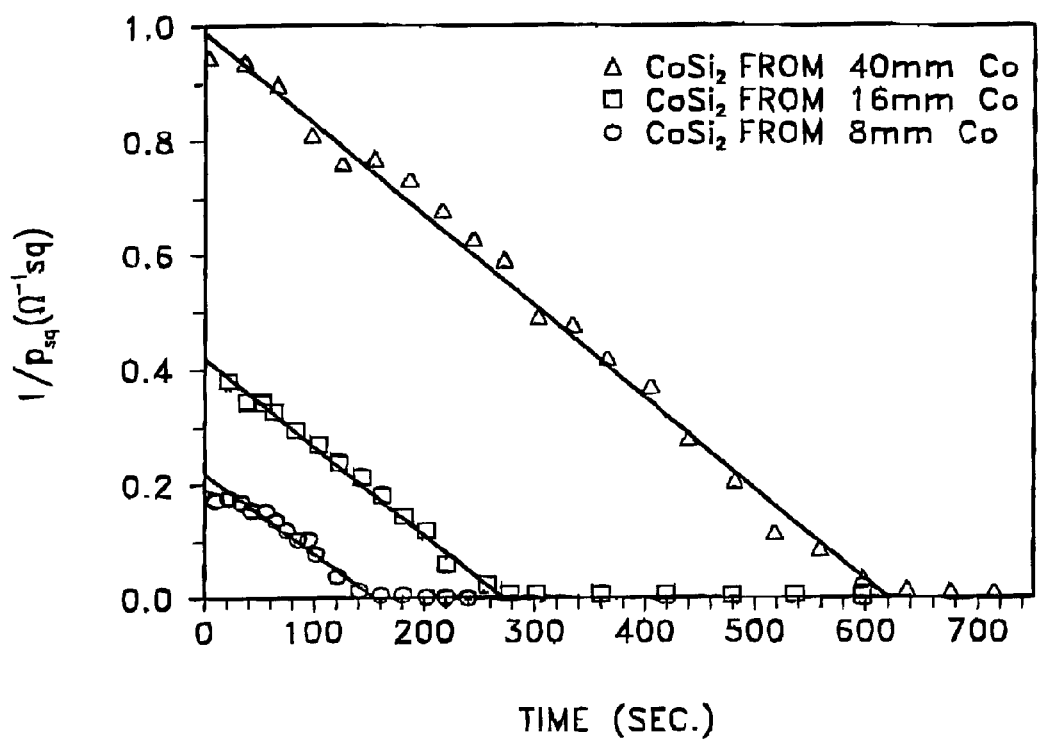
FIG. 1 shows the sheet conductance of CoSi$_2$ layers as a function of etching time in a 2 wt % HF solution.

Tables 1 & 2 summarize the experimental results obtained. FIG. 1 shows the sheet conductance of three different $CoSi_2$ layers as a function of etching time in a 2wt.% HF solution. The thickness of the original $CoSi_2$ layers was 29, 60 and 150 nm resulting in a sheet resistance of 5.5, 2.6 and 1.1 Ω/sq., respectively. For a homogeneous layer the inverse of sheet resistance (sheet conductance) is directly proportional to its thickness. It is clear that the values of the sheet conductance decrease with increasing etch time. This indicates that the $CoSi_2$ film is being attacked by the HF solution. Moreover, the silicide etching rate (determined by the slope of the curve) is constant and independent of the layer thickness. The near-zero values of the sheet conductivity are related to the conductance of the silicon substrate, indicating that the silicide was removed.

A sequence of SEM pictures taken after different etching times in FIG. 2 reveal surface morphology changes of the 60 nm $CoSi_2$ film.

Figure 2A:
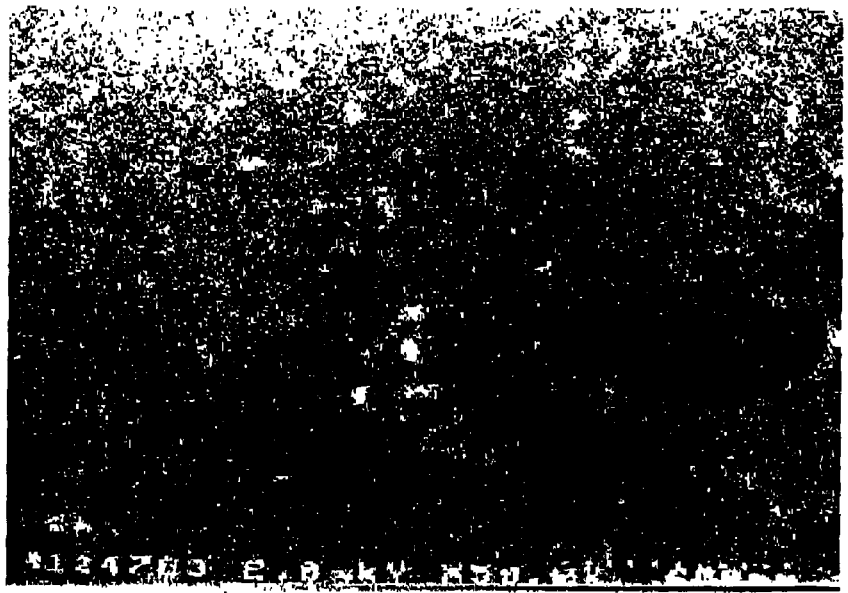
FIGS. 2a and b represent SEM pictures of CoSi$_2$ film (60 nm) surface after 20 s etching (FIG. 2a) and after 60 s (FIG. 2b) etching in 2% HF.
Figure 2B:

FIG. 2a shows the $CoSi_2$ layer surface after etching for 20 seconds. In FIG. 2b the sample was etched for 160 seconds and it is possible to see a delineation of the grain boundaries of the silicide film. It seems that the film is etched a little faster at the grain boundaries. After 300 second etching (not shown) the silicide is completely removed and the patterns observed are foot prints of the silicide grains on the silicon substrate surface.

Figure 3:
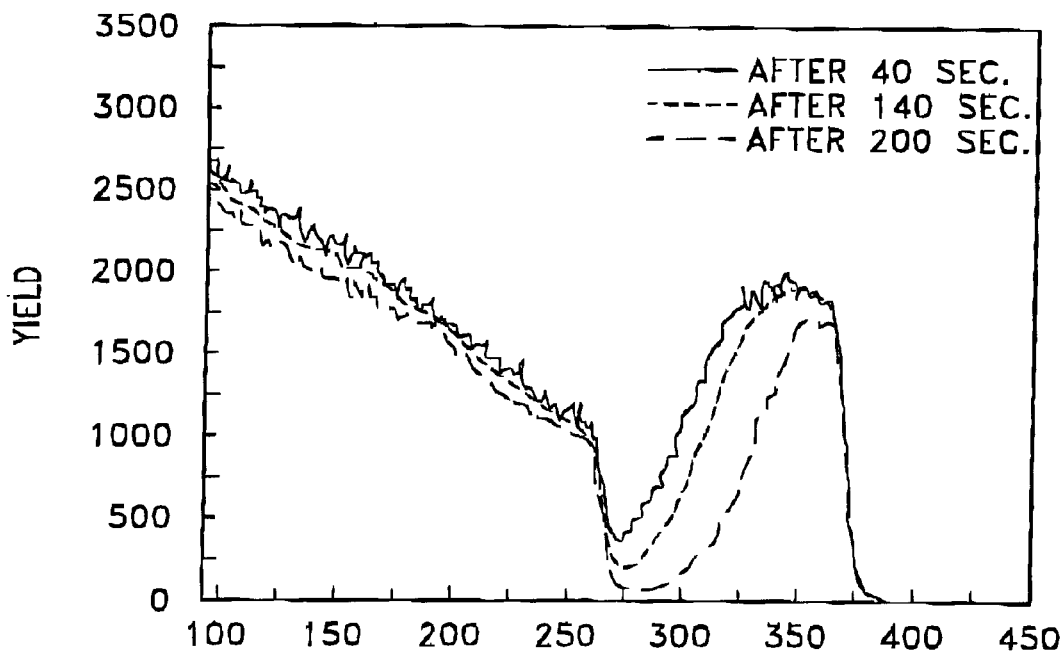
FIG. 3 represents RBS spectra of CoSi$_2$ film (60 nm) etched for 40, 140 and 200 s in 2% HF.

RBS spectra of samples etched for 40, 140 and 200 seconds as shown in FIG. 3 confirm the thinning of the silicide layers with etch time. These results strongly suggest a layer-by-layer etching mechanism of the $CoSi_2$ film.

Figure 4:
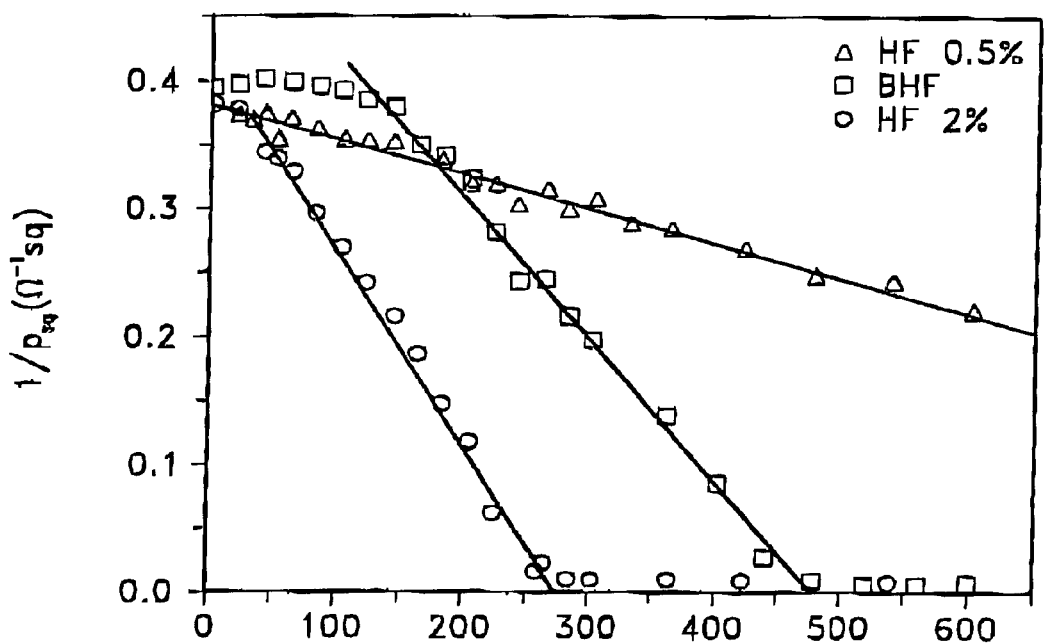
FIG. 4 represents the CoSi$_2$ (60 nm) sheet conductance as a function of etching time for different HF solutions.

Etching of $CoSi_2$ in 0.5 wt.% HF and BHF solutions were then investigated. Sheet conductance as a function of etching time is plotted for different HF solutions in FIG. 4, starting from 60 nm $CoSi_2$. The silicide etch rate is slightly lower for 0.5 wt. % HF than for 2 wt. % HF solutions. Furthermore, the etching of the silicide layer in 0.5% HF starts after approximately 120 seconds. It is not clear at the moment whether this delay can be attributed to the time necessary to remove the native oxide on the $CoSi_2$. The concentration of $H^+$ in this solution must also be considered. Initially it is insufficient to start the reaction, but due to an autocatalytic reaction the $H^+$ concentration increases and the silicide can be etched.

When BHF is used the silicide layer is attacked at a significant lower rate than in the case of 2% HF. This is unexpected since from experience of $SiO_2$ etching, BHF is much stronger etch solution with a significantly higher etch rate than 2% HF. In BHF the most abundant forms of the fluoride are $F^-$ and $HF_2^-$, whereas HF and $H_2F_2$ are more important in 2% HF. This difference in composition yields a lower acid grade for BHF (pH=4.5) than for a HF 2% solution (pH=1.5).

Figure 5:
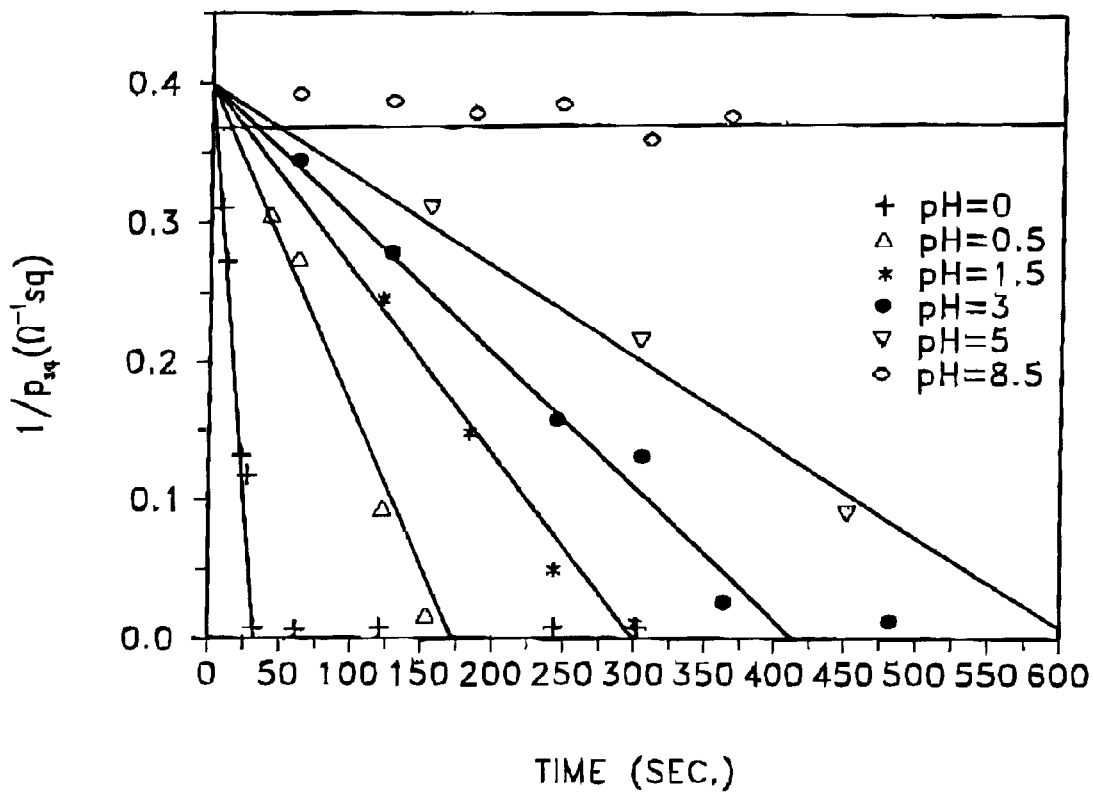
FIG. 5 represents the CoSi$_2$ (60 nm) sheet conductance as a function of etching time in 2% HF2 for different pH values.

To examine the influence of the pH on the etching of $CoSi_2$ in HF solutions, either $H_2SO_4$ or $NH_4OH$ were added to 2% HF to adjust its pH over a range of near zero to 8.5. FIG. 5 represents the sheet conductance values as a function of etch time for 2 % HF solutions with varying pH. By forming a more acidic solution the etch rate is increased. A 60 nm $CoSi_2$ layer is removed in less than 30 seconds when the pH of the solution is almost zero. On the other hand, the silicide layer does not seem to be attacked for the solution with the highest pH tested (pH=8.5). It is worth noticing that the sulfuric acid itself does not attack the silicide. In a solution with the same amount of $H_2SO_4$, but no HF, the silicide is not etched at all. The same experiment performed in diluted BHF showed the same trend: solutions with higher pH values etch cobalt silicide films at lower rates than solutions with lower pH values. These results confirm that the etching rate of $CoSi_2$ in HF based solutions is controlled predominantly by the $H^+$ concentration.

In order to describe quantitatively the $CoSi_2$ etch rate in 2% HF, the concentrations of the different species present in diluted HF solutions were calculated.

In these calculations the following equilibria were used:

$$HF = H^+ + F^-$$

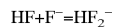

$$HF + F^- = HF_2^-$$

$$2HF = H_2F_2$$

Figure 6:
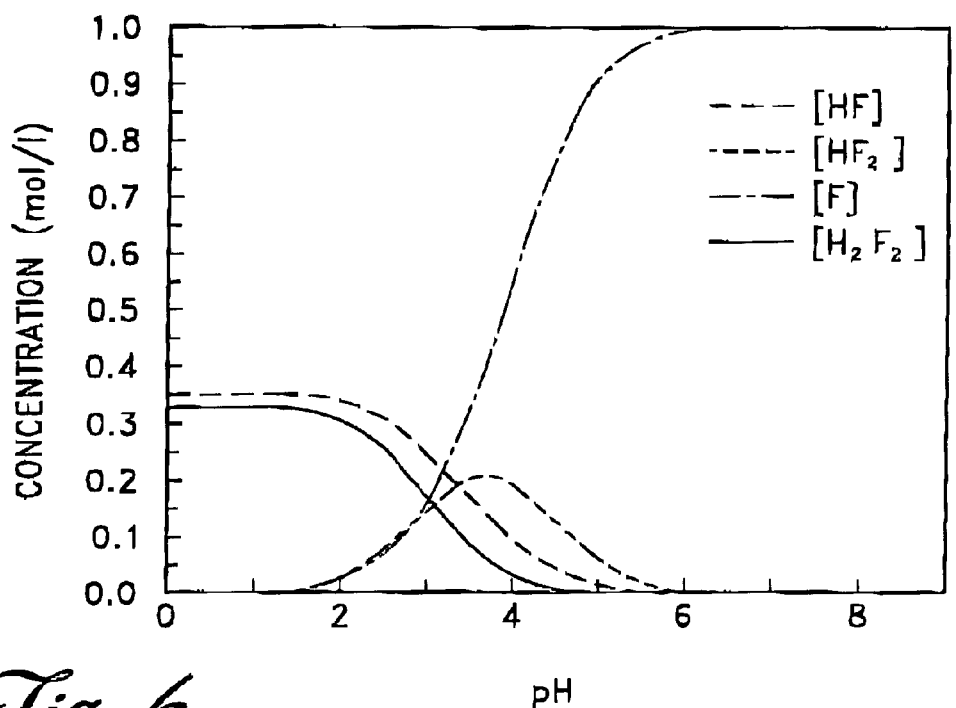
FIG. 6 represents the concentration of the different species present in a diluted HF solution as a function of its pH.

The result is shown in FIG. 6, where the species concentration is plotted as a function of the pH of the mixture. As can be seen, for low pH values (pH<1.5) HF and $H_2F_2$ are dominant and their concentrations remain constant. For intermediate pH values the concentrations of $F^-$ and $HF_2^-$ increase and for high pH values the solution is primarily $F^-$.

Figure 7:
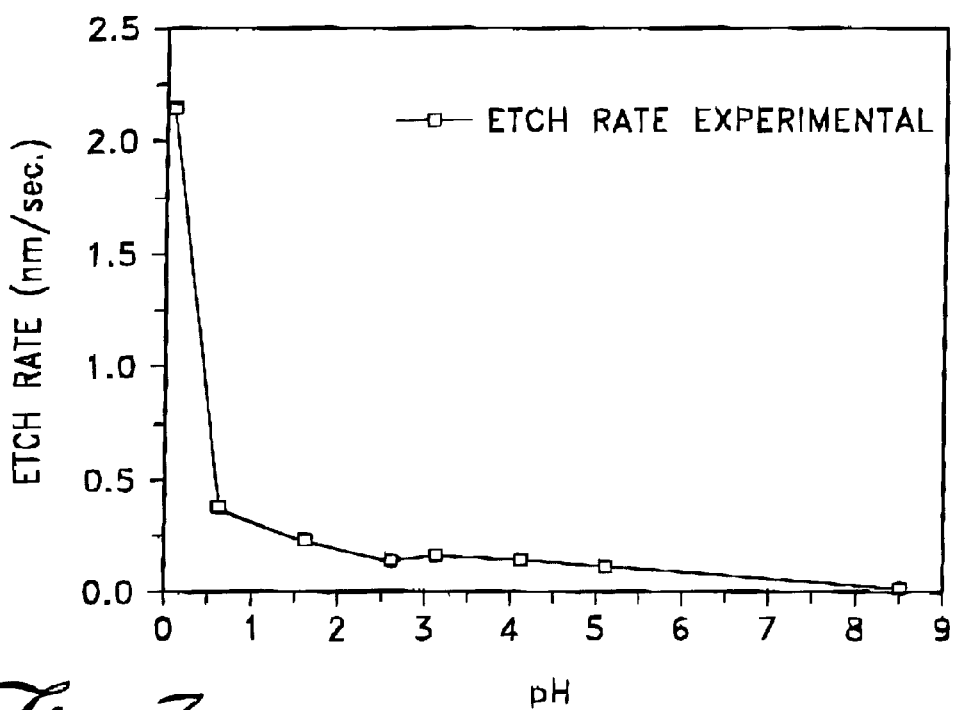
FIG. 7 represents the etch rate of CoSi$_2$ in 2% HF as a function of the pH of the mixture.

The etch rate (ER) of $CoSi_2$ in 2% HF as a function of the pH of the mixture is plotted in FIG. 7. In the region where pH <1.5 the silicide is etched very fast. Since the concentration of all fluoride containing species is constant in this region, $H^+$ plays an important role, being the dominant etching species. Between pH values of 1.5 and 5.5 the etch rate is lower and basically constant, and for pH values higher than 5.5 the silicide seems not to be attacked.

One aspect of the present invention relates to the manufacturing of $CoSi_2$/Silicon Schotky barrier detectors. Schottky barrier infrared detectors using silicide/silicon Schottky diodes are of a high interest for applications in the range of 1–10 $\mu$m. Among these detectors PtSi/Si Schottky IR detectors are the most developed devices with a cut-off wavelength of approximately 5–6 $\mu$m. In recent years, $CoSi_2$/Si Schottky detectors have been proposed as a promising candidate for IR applications in the range 1–3 $\mu$m.

FIGS. 8 more precisely represent the several steps of the etching process of a $CoSi_2$ layer strained to a Si substrate using an HF-based solution having a pH less than 1.5.

Figure 8A:
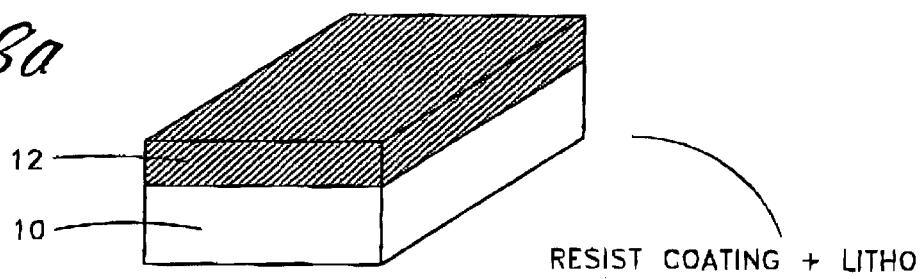
FIGS. 8a–d depict schematic views of the several steps of etching $CoSi_2$ layers used in fabrication of $CoSi_2/Si$ or $CoSi_2/Si_{1-x}Ge_x$ Schottky barrier detectors.

More particularly, FIG. 8a represents the Si substrate 10 on which a $CoSi_2$ layer 12 has been deposited.

Figure 8B:
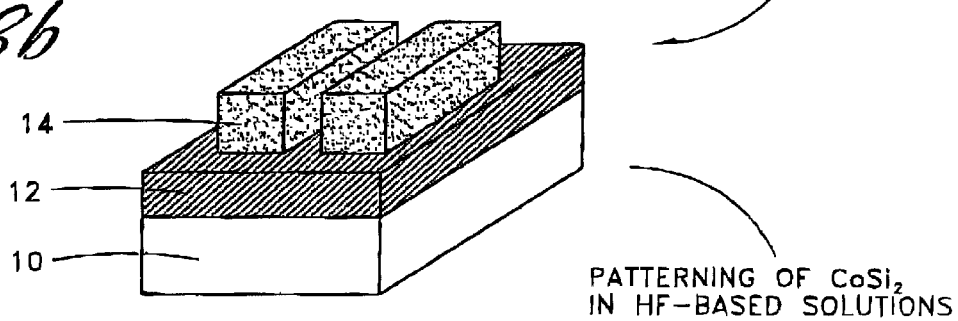
Figure 8C:
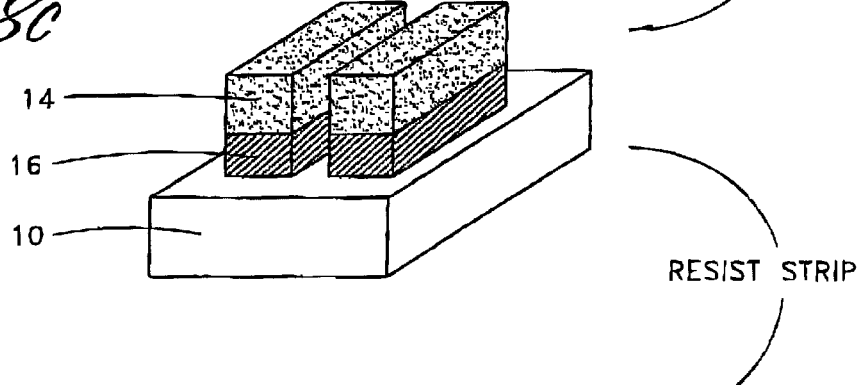

FIG. 8b represents the coating of a photo-resist strip 14 and the lithographic step for patterning of the $CoSi_2$ layer 12;

FIG. 8c represents the result obtained after the wet etching in a HF-based solution of the $CoSi_2$ layer 16 not covered by the photo-resist strip 14.

Figure 8D:
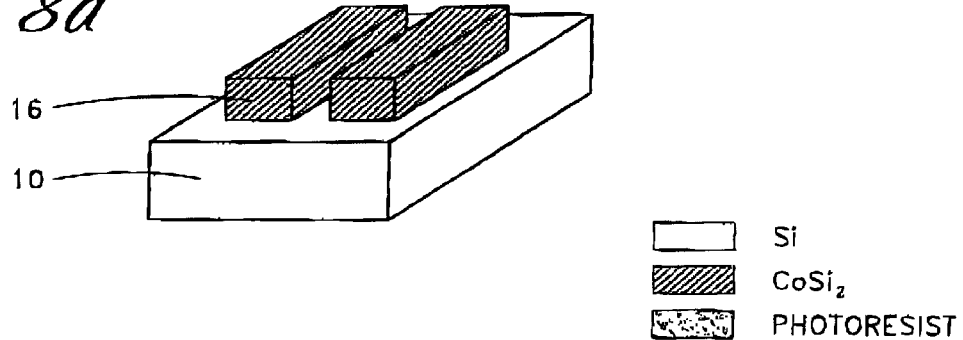

FIG. 8d represents the removal of the photo resist strip 14 leaving the required $CoSi_2$ patterning 16 on the Si substrate 10.

In order to illustrate the method of etching of the $CoSi_2$ layer, the manufacture of $CoSi_2/Si_{1-x}Ge_x$, infrared detector is described hereunder as a preferred embodiment of this process.

This fabrication could also advantageously be integrated into CMOS processes.

For silicidation studies, lightly doped ($N_A=5\times10^{16} cm^{-3}$) p-type Si wafers were used, whereas for detector experiments highly doped ($N_A=5\times10^{18} cm^{-3}$) wafers with lightly doped ($N_A=5\times10^{16} cm^{-3}$) epitaxial surface layers on top are used. Pseudomorphic $Si_{1-x}Ge_x$ layers and sacrificial Si surface layers are grown epitaxially on these samples. The deposition of the Si sacrificial layer on the SiGe layer is necessary in order to prevent any reaction of cobalt with the SiGe layer.

For the silicidation study samples, the buffer layer, the graded layer, the strained layer and the Si sacrificial layer had a thickness of 5 nm, 50 nm, 100 nm and 30 nm, respectively. For the detector samples, the thickness of the buffer layer was 5 nm, the thickness of the graded layer was 50 nm, and the thickness of the strained layer was 30 nm. The doping of the layers was p-type $10^{16} cm^{-3}$. The Ge-concentration x was x=0.2. The sacrificial Si-layer on top was 40 nm for the detector samples and 30 nm and 100 nm for the silicidation study samples.

Before the metal deposition, the wafers were cleaned by an HF-dip d(2%). Co layers of 10 nm were deposited on the silicidation study samples and Co layers of 7 nm were deposited on the detector samples. Since the silicidation conditions could not be controlled such that no reaction with strained $Si_{1-x}Ge_x$ layer could be guaranteed, the thicknesses of the sacrificial Si-layer for the detector samples were chosen to be slightly thicker than the thicknesses to be consumed by the sputtered Co thickness. Afterwards, the silicidation study samples were silicided in an AG Heatpulse rapid thermal processor system in nitrogen ambient at temperatures between 550° C. and 700° C. for 30 seconds. Detector samples were silicided at 600° C. After silicidation, a selective etch in $H_2SO_4/H_2O_2$ was carried out to remove the possibly remaining unreacted metal.

A $CoSi_2$/strained $Si_{1-x}Ge_x$ detector offers the big advantage that no metal leading to states that effectively reduce the minority carrier lifetime, is involved. The Si wafer has the function of the substrate. Since there is an additional layer involved, contacting the silicide becomes more difficult.

The contact to the thin $CoSi_2$ layer requires very critical etching steps and metallization steps after silicidation. Definition of the silicide areas is possible via a self-aligned silicide or also via silicide etching.

Another aspect of the present invention is to suggest a full integration process for fabrication of active transistors using self-aligned pocket implantation.

The use of self-aligned pocket implantation in full semiconductor integration processes for fabrication of active transistors is known. The full integration process starts with the definition of active area and field area, generally using local oxidation schemes. Wells to adjust for threshold voltage, to reduce anti-punchthrough current and control the immunity versus latch-up can be implanted prior to or after the active area and field definition process. Afterwards, after cleaning and conditioning the Si surface a high quality gate oxide is thermally grown, followed by a chemical vapor deposition of a polycrystalline or amorphous Si layer. This layer will be implanted and annealed so as not to destroy the gate during subsequent patterning.

After gate patterning, an implantation oxide is thermally grown. N-type and P-type lightly doped source and drain (LDD) are then implanted with respectively P or As and B or $BF_2$. An oxide layer is deposited uniformly over the wafer and subsequently etched without mask definition by an anisotropic dry etch. Due to the anisotropic etch, a spacer is formed at the polysilicon gate sidewalls. The etch is performed until complete removal of the oxide on the gate and source/drain regions. After cleaning, a new oxide is thermally grown. The gate and source/drain regions are then implanted and annealed.

After source/drain formation, the implantation oxide is removed, typically by a critical HF etch before Ti or Co sputtering for silicidation. Ti-sputtering is commonly used for dimensions equal to and larger than 0.35 $\mu$m and Co-sputtering and Co alloys for smaller dimensions. The silicidation consists commonly of a first initial heating and reaction step, followed by a selective etch based on ammoniumhydroxide for Ti-silicide and based on sulfuric acid for Co-silicide, and a final reaction step for complete formation of a low resistance silicide.

After silicidation, an intermediate layer dielectric is deposited, which is then patterned for contact windows, filled with a conductor and finally interconnected by one or more metal layers, each separated by an intermediate dielectric.

With shrinking dimensions, it is noticed that the control of the gate on the carriers conducting the current under the gate is reduced, due to the physical phenomenon called drain induced barrier lowering. The effect of drain induced barrier lowering can be countered by locally increasing the well dopant density for narrow gates. This can be done by implanting the well dopant at the same time as the LDD implantation but with a slightly deeper projected range or by a large angle tilted implant (LATID). This approach is called halo-implantation. This approach is very effective in decreasing the transistor leakage current for a maximum drive current, but due to the counterdoping the junction capacitance between source/drain regions and the substrate is increased and the depth of the source/drain regions is reduced. A better solution therefore is a pocket implantation self-aligned towards gate and silicide. The silicide has a larger stopping power towards implantation, about 1.5 times better than Si, so the well dopant implantation exceeds the projected range of the LDD, but not the junction depth and therefore it reduces the junction capacitance and does not reduce the junction depth.

The implantation can only be performed after the silicidation of the gate region, and the source/drain regions and therefore requires the use of disposable spacers. For a process using Ti-silicide two types of disposable spacers have been reported: first, the use of a TiN spacer by Pfiester et al. from Motorola in "An integrated 0.5 $\mu$m CMOS disposable TiN LDD/Salicide spacer technology", IEDM 89, 781–784, wherein a TiN layer is therefore deposited by chemical vapor deposition in nitrogen ambient, and subsequently etched in an anisotropic plasma to form a spacer at the polysilicon gate sidewall. The spacer is removed during the selective etch based on ammoniumhydroxide after the first silicidation step. Secondly, the use of a SiN spacer was reported by Hori et al. from Matsushita in "A Self-Aligned Pocket Implantation (SPI) Technology for 0.2 $\mu$m Dual Gate CMOS," IEDM 91, 641–644. In this case, the SiN spacer is formed by low pressure chemical vapor deposition of a uniform SiN layer and subsequent etch in an anisotropic plasma to form a spacer at the polysilicon gate sidewall. The spacer needs then to be removed after Ti-silicide formation. Only an isotropic plasma can remove the spacer selectively towards the Ti-silicide.

The main drawback shown in the first reference is that the deposition of a thick TiN layer and the subsequent anisotropic etching to obtain a spacer is not standardly available in a semiconductor manufacturing environment.

The main drawback of the second approach is extra development of an isotropic SiN etching process and the danger of destruction of gate quality due to plasma charging.

The process according to the present invention is based on the use of the conventional semiconductor manufacturing process steps until gate and source/drain formation and anneal.

After anneal, the implantation oxide of the junctions is removed by a wet chemical etch e.g. 2% HF (in $H_2O$). Co is sputtered on the surface and the subsequent silicidation is performed using a two step heat treatment with a selective etch after the first heat treatment Up to this process step, all steps are standard for a Co-silicide semiconductor manufacturing process.

According to a preferred embodiment described in FIGS. 9, the full integration process starts with the definition of active area and field area, generally using local oxidation schemes. Wells to adjust for threshold voltage, to reduce anti-punchthrough current and control the immunity versus latch-up can be implanted prior or after the active area and field definition process. Afterwards, after cleaning and conditioning the Si surface 3 a high quality gate oxide 2 is thermally grown, followed by a chemical vapor deposition of a polycrystalline or amorphous Si layer. This layer is implanted and annealed so as not to destroy the gate during subsequent patterning.

Figure 9A:
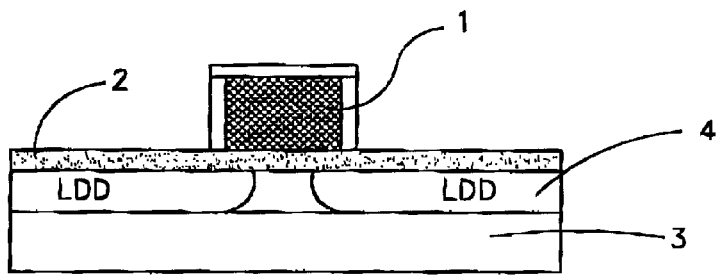
FIGS. 9a–e present cross sectional views of an active transistor according to the several steps of the formation of semiconductor having a self-aligned pocket implantation using selective removal of oxide spacer compared to $CoSi_2$ layers.
Figure 9B:
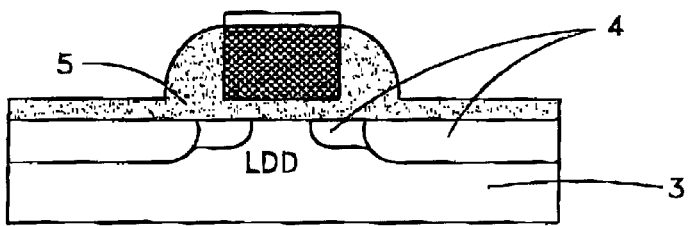
Figure 9C:
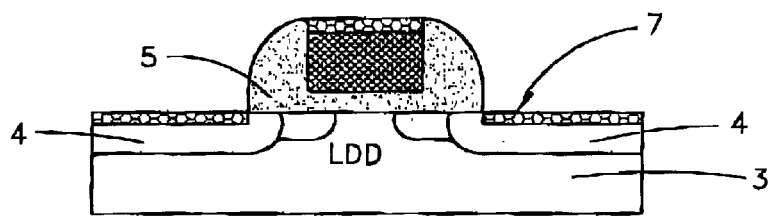
Figure 9D:
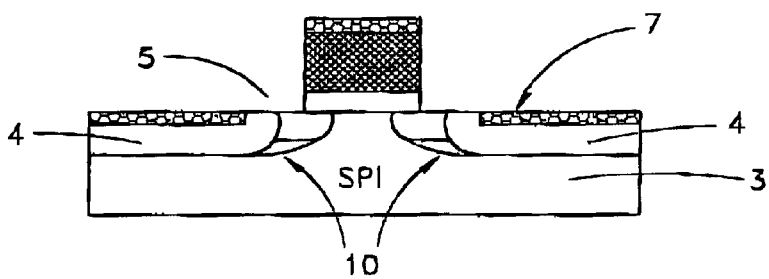
Figure 9E:
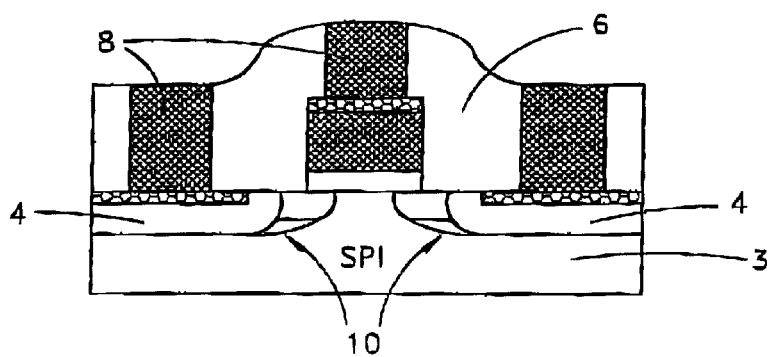

After gate patterning, an implantation oxide 2 is thermally grown. n-type and p-type lightly doped source and drain 4 (LDD) are then implanted with respectively P or As and B or $BF_2$ (see FIG. 9a).

An oxide layer is deposited (Low Pressure Chemical Vapor Deposition) uniformly over the wafer and subsequently etched without mask definition by an anisotropic dry etch. Due to the anisotropic etch, a spacer 5 is formed at the polysilicon gate sidewalls. The etch is performed until complete removal of the oxide on the gate and source/drain regions. After cleaning, a new oxide is thermally grown. The gate and source/drain 4 regions are then implanted and annealed (see FIG. 9b).

After junction formation, the implantation oxide is removed, typically by a critical HF etch before Co or Co-alloy sputtering for silicidation. The silicidation consists of a first initial heating and reaction step, followed by a selective etch based on a sulfuric acid hydrogen peroxide solution, and a final reaction step, for complete formation of a low resistance silicide 7 (see FIG. 9c).

After Co-silicidation, the oxide spacer is etched selectively towards the Co-silicide by the appropriate selection of the pH of an aqueous HF chemical etch. To improve the process window for the selective etch, it is preferable to use a fast oxide etching HF based solution with a pH close to neutral. The etch rate of the Co-silicide in a near neutral HF based solution is nearly independent of the HF concentration. To achieve an acceptable process window towards manufacturing yield and quality, a HF solution with HF concentration higher than 2% is required to etch the spacer in a short time and to reduce the time during which the Co-silicide is in contact with the etch solution. The pH of the solution is required to be higher than 3 to obtain a significantly low etch rate of the Co-silicide during the exposure time.

The advantage of the newly proposed manufacturing process is the use of a Co-silicide layer, with well controlled etching characteristics and commonly available chemicals such as hydrogen fluoride (HF) and sulfuric acid ($H_2SO_4$).

For the selective etch of an oxide spacer, available in most standard semiconductor manufacturing processes, HF solutions with a pH>3 and preferably with a pH>5.5 can be adjusted to have a high etch rate for the oxide spacer and a minimum etch rate for the Co-silicide layer, as described in the preferred embodiment.

Moreover, this manufacturing process requires a minimum of process development, as the required chemicals are already used in the conventional process and the influence of this wet chemical etchant on gate oxide quality has already been extensively studied.

Preferably, the HF-based solution is a buffered HF(BHF) solution. The BHF solution is formed by mixing 1 part of HF 50% and 7 parts of $NH_4F$ 40%. The pH of this solution is higher than 3. Moreover the BHF etch of the oxide spacer is selective towards the gate oxide with a ratio about 3:1. The etching time in this case is 20 seconds.

After removal of the oxide spacer, a pocket implantation 10 is performed, self-aligned towards the gate and the source-drain junctions. This pocket implantation counters the drain induced barrier lowering phenomenon for small gatelength CMOS devices, allows for maximum drive current and a minimum leakage current, and does not increase the junction capacitance of source and drain junctions considerably (see FIG. 9d). In one aspect of the present invention, the dopants are of the opposite kind for the source and drain implants. In another aspect of the present invention, the dopants are of the same kind for the source and drain implants.

For NMOS devices a B pocket implantation at 40 keV is performed and for pMOS devices a P pocket implantation at 100 keV is performed.

After pocket implantation, conventional CMOS manufacturing process is continued. An intermediate layer dielectric 6 is deposited, which is patterned for contact windows 8 filled with a conductor and finally interconnected by one or more metal layers, each separated by an intermediate metal dielectric (see FIG. 9e).

While particular embodiments of the invention have been described in detail, it will be apparent to those skilled in the art that these embodiments are exemplary rather than limiting, and the true scope of the invention is that defined in the following claims.

What is claimed is:

1. A method of etching a $CoSi_2$ layer comprising adjusting the pH of an HF-based solution to achieve a desired etching rate; and etching said layer using the pH-adjusted solution at the desired etching rate.

2. The method of claim 1, wherein said pH of said HF-based solution is adjusted by adding pH modifying chemicals to said HF-based solution.

3. The method of claim 2, wherein said pH modifying chemicals are selected from the group consisting of $H_2SO_4$, HCl and $NH_4OH$.

4. The method of claim 2, wherein said HF-based solution is buffered.

5. The method of claim 1, wherein said pH of said HF-based solution is from about 0 to about 1.5.

6. The method of claim 1, wherein said pH of said HF-based solution is from about 1.5 to about 5.5.

7. The method of claim 1, wherein said pH of said HF-based solution is from about 5.5 to about 14.

8. A method of manufacturing $CoSi_2/Si$ Schottky barrier infrared detectors comprising the steps of:

a) growing a $Si_{1-x}Ge_x$ layer on a silicon substrate;

b) growing a Si sacrificial layer on the top of the $Si_{1-x}Ge_x$ layer;

c) depositing a Co layer on said Si sacrificial layer;

d) heating the Co layer to obtain a $CoSi_2$ layer;

e) depositing a photoresist strip on said $CoSi_2$ layer;

f) developing the photo-resist strip using a masking layer in order to create the required patterning of the $CoSi_2$ layer;

g) etching the $CoSi_2$ layer with a HF-based solution having a pH value smaller than 1.5; and h) removing the photoresist strip.

9. The method of claim 8 wherein said Schottky barrier infrared detectors are $CoSi_2/Si_{1-x}Ge_x$ Schottky barrier infrared detectors.

10. The method of claim 4, wherein the HF-based solution is buffered with $NH_4F$.

* * * * *